US006949927B2

(12) United States Patent
Goetz

(10) Patent No.: US 6,949,927 B2
(45) Date of Patent: Sep. 27, 2005

(54) MAGNETORESISTIVE MAGNETIC FIELD SENSORS AND MOTOR CONTROL DEVICES USING SAME

(75) Inventor: Jay Goetz, Deephaven, MN (US)

(73) Assignee: International Rectifier Corporation, El Segundo, CA (US)

( * ) Notice: Subject to any disclaimer, the term of this patent is extended or adjusted under 35 U.S.C. 154(b) by 265 days.

(21) Appl. No.: 10/228,881

(22) Filed: Aug. 26, 2002

(65) Prior Publication Data

US 2003/0057938 A1 Mar. 27, 2003

Related U.S. Application Data

(60) Provisional application No. 60/314,630, filed on Aug. 27, 2001.

(51) Int. Cl.[7] ................................................ G01R 33/09
(52) U.S. Cl. ................. 324/252; 324/207.21; 338/32 R
(58) Field of Search ........................... 324/251, 207.21, 324/249, 117 R; 338/32 R

(56) References Cited

U.S. PATENT DOCUMENTS

| | | | | |
|---|---|---|---|---|
| 3,979,600 A | | 9/1976 | Bohning | |
| 4,075,671 A | | 2/1978 | Cheatham et al. | |
| 4,385,283 A | | 5/1983 | Delapierre | |
| 4,504,787 A | | 3/1985 | Planer | |
| 4,603,365 A | * | 7/1986 | Nakamura | 362/55 |
| 4,922,606 A | | 5/1990 | Alexander et al. | |
| 4,937,521 A | | 6/1990 | Yoshino et al. | |
| 5,621,377 A | | 4/1997 | Dettmann et al. | |
| 5,644,228 A | | 7/1997 | Jeffers et al. | |
| 5,686,837 A | | 11/1997 | Coehoorn et al. | |
| 5,708,407 A | | 1/1998 | Mouchot et al. | |
| 5,933,003 A | | 8/1999 | Hebing et al. | |
| 5,952,825 A | | 9/1999 | Wan | |
| 6,020,738 A | * | 2/2000 | Van Den Berg et al. | 324/252 |
| 6,069,476 A | | 5/2000 | Vieux-Rochaz et al. | |
| 6,232,776 B1 | | 5/2001 | Pant et al. | |
| 6,252,390 B1 | | 6/2001 | Black, Jr. et al. | |

* cited by examiner

*Primary Examiner*—Bot Ledynh
*Assistant Examiner*—Reena Aurora
(74) *Attorney, Agent, or Firm*—Ostrolenk, Faber, Gerb & Soffen, LLP

(57) ABSTRACT

A magnetic field measuring device useful for measuring a magnetic field associated with an electric current, including a bus section connectable into the path of the electric current, a first magnetoresistive (MR) bridge oriented to be sensitive to the magnetic field of a current in the bus section, a second MR bridge oriented to be substantially insensitive to the magnetic field of a current in the bus section, a biasing coil configured and positioned to apply a magnetic field to the first and second MR bridges, whereby the sensitivity of the first MR bridge can be controlled; and a signal processing device responsive to a voltage output of the second MR bridge to control the current through the biasing coil. The device exhibits good rejection of stray magnetic and electric fields, is convenient to use, and can be fabricated in a single chip, with or without associated signal processing and conditioning circuitry, using conventional IC processing techniques.

27 Claims, 15 Drawing Sheets

MAGNETORESISTIVE MAGNETIC FIELD SENSORS AND MOTOR CONTROL DEVICES USING SAME

This application claims the benefit of provisional application Ser. No. 60/314,630 filed on Aug. 27, 2001

BACKGROUND OF THE INVENTION

1. Field of the Invention

The present invention relates to magnetoresistive (MR) sensing devices, and more particularly, to MR sensing devices for measuring magnetic fields having improved rejection of stray magnetic fields, and temperature stability, and other improved features. Such devices find utility as current sensors and diagnostic devices in motor controllers, as sensors for powerline communication systems, for position sensing using the fields of permanent magnets to indicate position, and in other applications where information can be derived from time or spatially varying magnetic fields.

2. Related Art

Conventionally, current flowing in a circuit has been measured using current transformers or Hall Effect sensors or by measuring voltage across a reference element in the circuit. Such current sensors are subject to several disadvantages, especially when used with motor controllers.

For example, current transformers are frequency sensitive, and in any event, occupy substantial space, while Hall Effect devices requires use of toroids which exhibit hysteresis and limited bandwidth. Measuring voltage across a reference element is also not completely satisfactory due to insertion loss in the sensing element, problems with signal couplers, etc.

Certain nickel-iron alloys such as Permalloy ($Ni81Fe19$) are known to be magnetoresistive, i.e., to exhibit electrical resistance which depends on the strength and direction of nearby magnetic fields, and it has been proposed to use such devices as current sensors by combining several sensor elements in a Wheatstone bridge mounted in proximity to a current-carrying bus or a current trace on a semiconductor substrate. A reference voltage is applied to the bridge and voltage output, which changes due to magnetically induced resistance changes, is measured as an indication of an incident magnetic field.

However, known MR sensing elements exhibit some undesirable properties. Among these are excessive responsiveness to stray magnetic and electric fields, narrow range of linearity (making measurement over a large current range difficult), sensitivity to changes in ambient temperature, (with the consequent need for careful calibration during installation, and frequent re-calibration depending on the accuracy required). Various techniques have been proposed for dealing with these problems, but these are often complex and costly, and no completely successful solutions are known to exist.

Further, to avoid the need to insert a bus section into the current carrying circuit, some existing devices have employed multiple sensor chips installed in mounting clamps which are attached to the current carrying busses. The valve of this approach, however, is also problematic as such devices are quite expensive and the mounting clamps makes them inconvenient to use, especially for measurements made on printed circuit boards. Another approach has multiple sensor chips arranged around a slot or hole through which passes the current carrying conductor or above/below or on either side of a circuit board trace or conductor mounted on the circuit board. This approach allows for PC board mounting, but requires two sensor chips and takes up extra space.

Thus, a need clearly exists for improved MR sensors for measuring current in motor control devices and similar applications which overcome the above problems. The present invention seeks to meet this need.

SUMMARY OF THE INVENTION

According to the present invention, an MR magnetic field sensing device is provided in the form of a self contained sensor chip including a measuring bridge, a compensation bridge, and a biasing coil, of unique and novel geometry. The sensor chip and associated signal processing circuitry cooperate to provide closed loop temperature compensation and sensitivity control.

In the specific context of a current sensor for a motor control system, the sensor chip includes a current bus segment designed for insertion in the path of the current being measured in an improved and convenient manner.

The resulting design provides good temperature stability, and rejection of stray magnetic and electric fields, and a linear operation over a wide range of measured currents.

The measuring device is designed so the sensor chip can be fabricated using conventional lead frame stamping and plastic overmolding packaging techniques to produce surface-mount packages. These allow inexpensive, easy and reliable connection of the measuring bus segment into the path of the current being measured, and of the sensing elements to external signal processing devices.

According to one aspect of the invention, there is provided a magnetic field measuring device having a first MR bridge alignable to be substantially sensitive to the magnetic field to be measured, a second MR bridge alignable to be insensitive to the magnetic field to be measured, a biasing coil that applies a magnetic field to the first and second bridges, whereby the sensitivity of the first bridge can be controlled in a closed loop fashion, and a signal processing device responsive to a voltage output of the second bridge to control the current through the biasing coil.

Further according to this aspect of the invention, the magnetic field being measured is associated with an electric current; and the magnetic field measuring device further includes a bus segment connectable into the path of the electric current, with the first bridge being oriented relative to the bus segment to be sensitive to the magnetic field of a current in the bus segment, and the second bridge being oriented relative to the bus segment to be insensitive to the magnetic field of a current in the bus segment.

According to a second aspect of the invention, a current measuring device is provided in the form of a chip including a bus segment comprised of two parallel legs on opposite sides of a center line, the legs being connected together at respective first ends and connectable at respective second ends into the current path, a first MR bridge having two half-bridge sections positioned with approximate symmetry relative to the center line between the legs of the bus segment, a second MR bridge positioned substantially along the center line of the bus segment, and a biasing coil configured and positioned to apply a biasing magnetic field to the two bridges.

Further according to this aspect of the invention, the first bridge is a used to sense the magnetic field associated with the current being measured, and the second bridge is a compensation bridge used to measure the magnetic field associated with the biasing coil current. A signal output of the compensation bridge is used in a closed loop control system to provide temperature compensation and sensitivity control for the measuring bridge.

Also according to this aspect of the invention, each leg of the bus segment may be split into two spaced portions parallel to the center line with the first MR bridge located as close as possible to the centerline and overlying as little of the respective legs as possible (to reduce capacitive coupling of common mode noise to the bridge). The legs are connected at the respective first ends by a segment disposed transverse to the center line.

According to a third aspect of the invention, the first bridge is comprised of two half-bridge sections having the same polarity of response to a given direction of magnetic field and the second bridge is comprised of two half-bridge sections having respective opposite polarities of response to a given direction of magnetic field.

According to a fourth aspect of the invention, the two bridges are formed on a single die which is positioned on the bus segment when the sensor chip is assembled.

According to a fifth aspect of the invention, the magnetoresistive segments that form the first and second bridges include "barber pole" shorting strips, and the biasing coil traverses the first (measuring) bridge parallel to the magnetic field of the current being measured, and traverses the second (compensation) bridge in a direction such that the magnetic field of the bias current is in the same direction as, or orthogonal to, the net current vector of the current flowing in the second bridge circuit, whereby the second bridge can be used to measure the current through the biasing coil.

According to a sixth aspect of the invention, the shorting strips on the compensation bridge may be dispensed with. Instead, the magnetic strips comprising the legs of the bridge can be arranged in a herringbone layout.

According to a seventh aspect of the invention, the biasing coil is arranged to cross the bridges in a spiral fashion; for example, one or more spirals crossing each half bridge or bridge leg in a direction and order determined by the MR strip arrangement and the barber pole configuration.

According to an eighth aspect of the invention, the biasing coil is configured to cross the MR bridges in a spiral fashion, e.g., with one or more turns crossing each leg of each bridge in a direction and order that is related to the configuration of the MR strips and the layout of the barber pole shorting strips.

In one embodiment, the biasing coil is comprised of a first spiral which crosses the measuring bridge a plurality of times in a first direction, and crosses one of the half bridges of the compensation bridge a plurality of times in a second direction, and a second spiral which crosses the second half bridge of the compensation bridge a plurality of times in the second direction. The shorting strips on the legs of the compensation bridge are oriented so that when the biasing coil crosses the first half bridge of the compensation bridge, the magnetic field of the biasing current is oriented either parallel or orthogonal to the direction of the net bridge current vector in the first leg crossed by the biasing coil and is reversed relative to the bridge current in the second leg, and, when the biasing coil crosses the second half bridge of the compensation bridge, the direction of magnetic field of the biasing current relative to the net bridge current vector is reversed from that in the first half bridge. This construction yields excellent isolation of the compensation bridge from the effects of the magnetic field of the current being measured.

According to another embodiment, the biasing coil is comprised of a first spiral which crosses the measuring bridge a plurality of times in a first direction, and crosses one of the half bridges of the compensation bridge a plurality of times in a second direction, and a second spiral which crosses the second half bridge of the compensation bridge in a third direction which is opposite to the second direction. The shorting strips on the legs of the compensation bridge are oriented so that when the biasing coil crosses the first half bridge of the compensation bridge, the direction of magnetic field of the biasing current is the same relative to the direction of net bridge current vector in the two half bridge legs as it is when the biasing coil crosses the second half bridge of the compensation bridge. This construction yields excellent isolation of the second bridge from the effects of stray magnetic fields.

According to this embodiment, the second spiral may be arranged to cross only the second half bridge of the compensation bridge.

According to another embodiment, the biasing coil is comprised of a spiral which crosses the first MR bridge a plurality of times in a first direction, and a serpentine section which crosses the second MR bridge a plurality of times in succession in alternating opposite directions. On each MR strip, the barber pole shorting strips are laid out in groups, the number of groups being equal to the number of crossings of the MR strip by the biasing coil. The shorting strips in the first group all lie at a first angle relative to the length of the MR strip. In the second group, the shorting strips all lie at a second angle which is equal and opposite to the first angle. This alternating pattern is continued for each group, and is the same for all of the strips on the second bridge.

In this embodiment, all four legs comprising the two half bridges are axially aligned along the center line of the measuring bus, and the directions at which the biasing coil crosses the legs of the bridge, and the layout of the shorting strips is such that the magnetic field of the biasing current is alternatingly parallel or orthogonal to the bridge current.

Also in this embodiment, the first crossing of the first half bridge of the second MR bridge by the biasing coil may be in the opposite direction from the first crossing of the second half bridge.

This embodiment yields excellent isolation of the second bridge from the effects of stray magnetic fields, and also from the effects of the magnetic field of the current being measured by the first bridge.

According to a ninth aspect of the invention, a current sensing device is provided including a first substrate and a bus mounted on the first substrate to carry a current to be sensed, the bus having two parallel legs on opposite sides of a center line, the legs being connected together at respective first ends and connectable at respective second ends into the path of the current. A second substrate having a first side positioned adjacent to the bus, has two MR bridges formed on a second side of the second substrate, the first bridge being oriented to be sensitive to the magnetic field of a current in the bus and the second bridge being oriented to be substantially insensitive to the magnetic field of a current in the bus. A non-conductive layer overlies the first and second bridges, and an electrically conductive strip overlies the non-conductive layer and is shaped and positioned to apply a biasing magnetic field to the first and second bridges. The device includes a plastic encapsulating outer shell, and a plurality of leads extend through the shell to provide electrical connections to the bus, the first and second bridges and the biasing strip.

Also according to the ninth aspect of the invention, the second substrate and the first and a second bridges are formed as a monolithic structure on a single die which is then mounted just above the bus, and with the first and second bridges positioned as much as possible on the center line and between the legs of the bus to reduce the effects of stray electric fields.

Other features and advantages of the present invention will become apparent from the following description of the invention which refers to the accompanying drawings.

DETAILED DESCRIPTION OF EMBODIMENTS OF THE INVENTION

Figure 1:
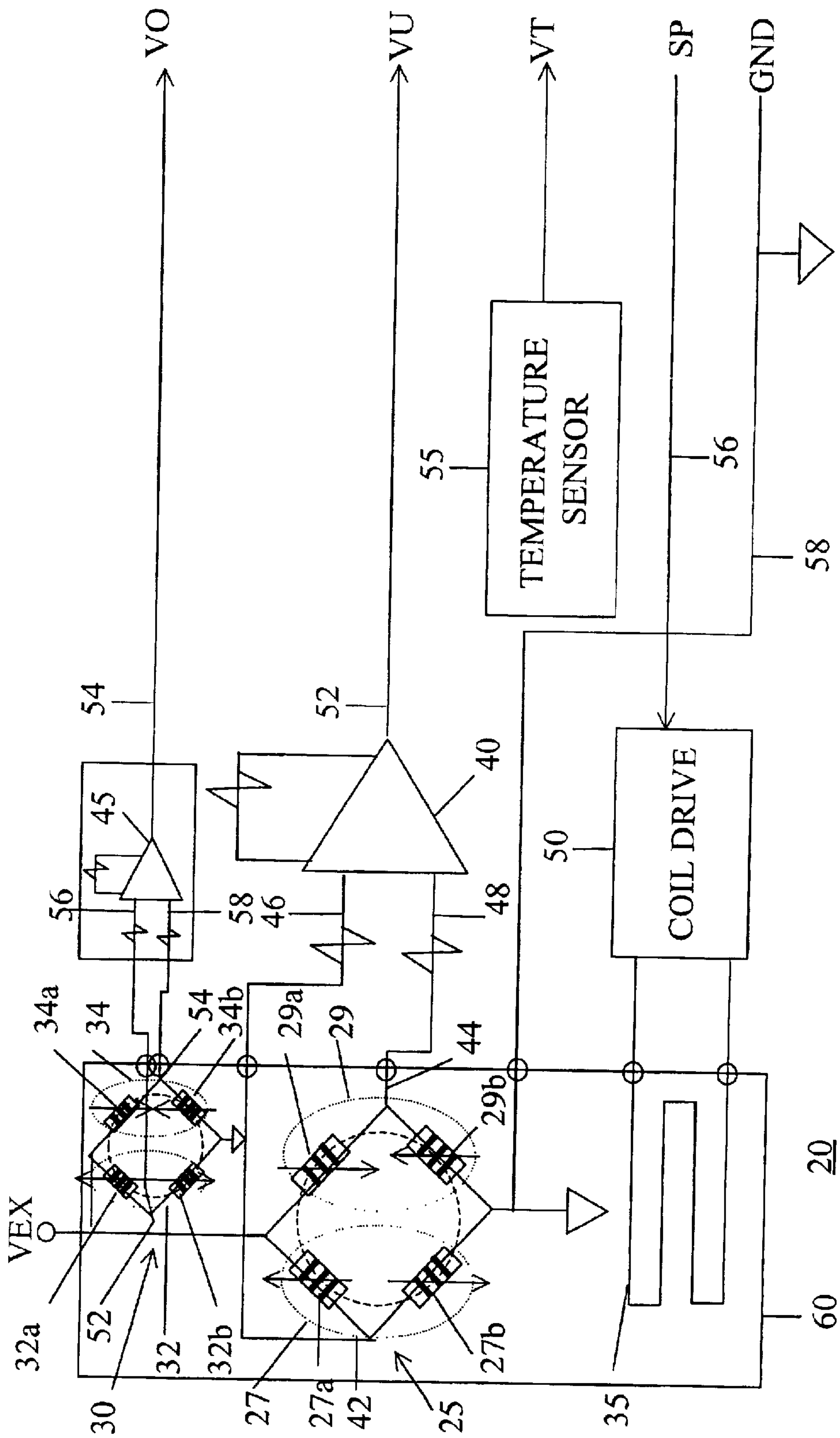
FIG. 1 is an electrical schematic diagram of a magnetic field measuring device according to the invention.

Referring first to FIG. 1, the remote sensing device according to the invention, generally noted at 20, comprises a first magnetoresistive bridge 25, a second magneto resistive bridge 30, a biasing coil 35, a first differential amplifier 40, a second differential amplifier 45, and a drive circuit 50 for coil 35. A temperature sensor 55 may also be provided as discussed below.

First MR bridge 25 is comprised of two half bridge sections 27 and 29. Second MR bridge 30 is similarly formed of two half bridge sections 32 and 34. Half bridge sections 27 and 29 are respectively formed of quarter bridge sections or legs 27*a* and 27*b*, and 29*a* and 29*b*. Similarly, half bridge sections 32 and 34 are respectively formed of quarter bridge sections or legs 32*a* and 32*b*, and 34*a* and 34*b*.

The common point between legs 27*a* and 27*b* is connected by a signal path 42 to a first input 46 of differential amplifier 40. The common point 44 between legs 29*a* and 29*b* is connected by a second signal path 44 to a second input 48 differential amplifier 40. Similarly, the common point between legs 32*a* and 32*b* is connected by a signal path 52 to a first input 56 of differential amplifier 45 and the common point between legs 34*a* and 34*b* is connected by a signal path 54 to a second input 58 of differential amplifier 45.

The output 52 of differential amplifier 40 provides an output signal $V_u$ and the output 54 of differential amplifier provides an output signal $V_o$. As described below, bridge 25 is configured and oriented to be sensitive to the magnetic fields associated with a current being measured. Second bridge 30 is configured and oriented to be substantially insensitive to the fields associated with the current being measured, but to provide an output signal representative of the magnetic fields associated with the current flowing through biasing coil 35. Thus, bridge 25 serves as the current measuring bridge, and bridge 30 serves as a compensation bridge.

The common points between quarter bridge sections 27*a* and 29*a* of bridge 25 and between quarter bridge sections 32*a* and 34*a* of bridge 30 are connected to an excitation voltage Vex while the common points between quarter bridge sections 27*b* and 29*b* of bridge 25 and quarter bridge sections 32*b* and 34*b* of bridge 30 are connected to a common ground path 58. Thus, the signal outputs for bridges 25 and 30 to differential amplifiers 40 and 45 are representative of the differences between the magnetoresistive properties of the bridge legs as affected by the incident magnetic fields.

Bridges 25 and 30 are advantageously constructed in monolithic form on a single die 60 which is then assembled along with a measuring bus segment (not shown in FIG. 1 in the interest of clarity) and biasing coil 35 into a single chip 60. Alternatively, greater integration may be achieved if desired by including differential amplifiers 40 and 45, coil drive 50, and temperature sensor 55 together with the sensor components in a single chip or on an adjacent die in a single package.

Figure 2:
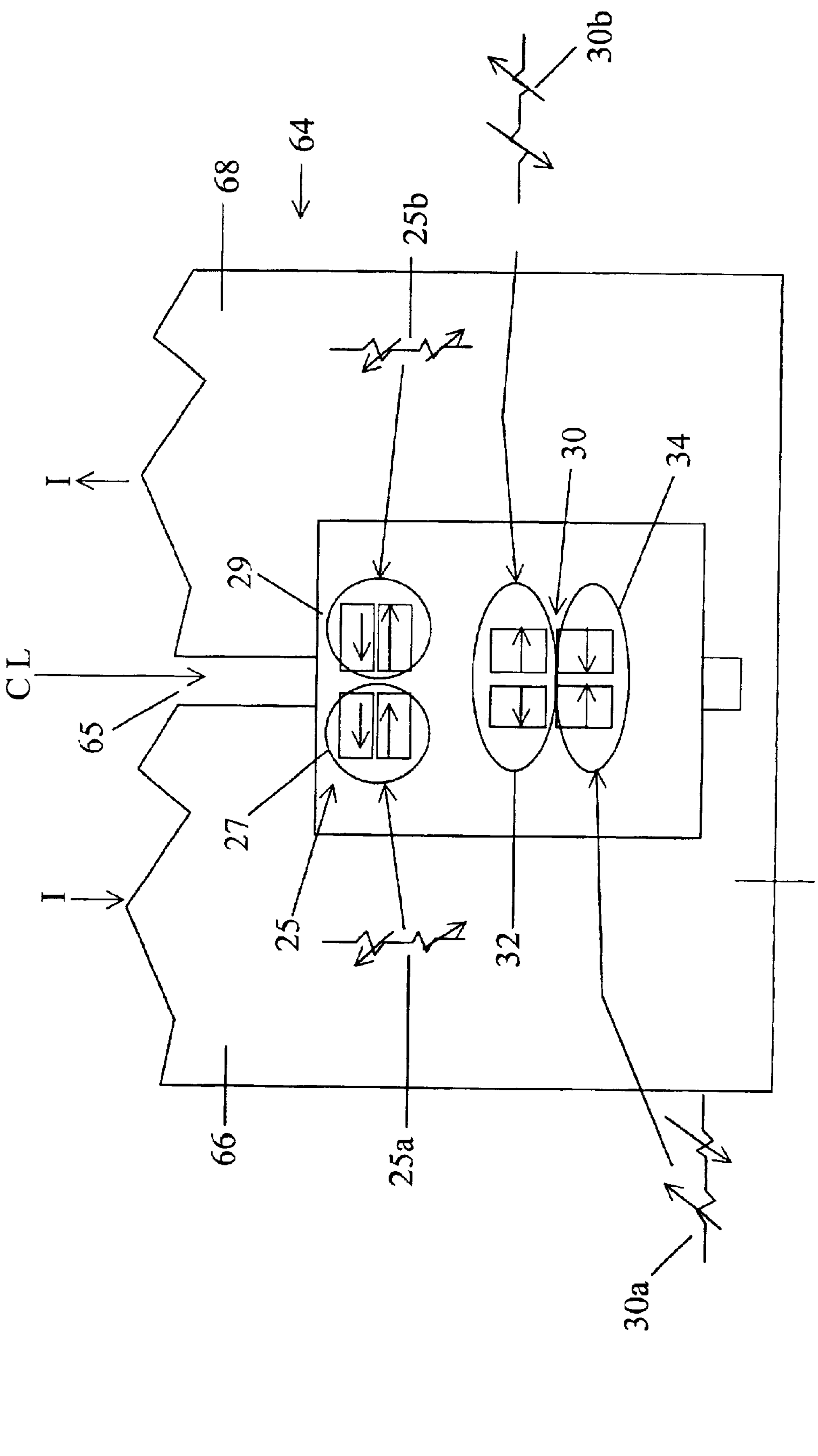
FIG. 2 is schematic diagram showing the layout of the sensing bridges relative to the current bus according to the invention.

The orientation of bridges 25 and 30 relative to the measurement bus section is illustrated in FIG. 2. According to the invention, measuring bus 64 is comprised of first and second legs 66 and 68 lying parallel to each other on opposite sides of a center line CL. The legs are connected at one end by the transverse portion 70. Leg 66 is shown as the incoming path for the current to be measured while leg 68 provides the outgoing path. It will, of course, be understood that the directions can be reversed.

As illustrated in FIG. 2, both bridges 25 and 30 are positioned substantially on center line CL. For measuring bridge 25, half bridge sections 29 and 29 are preferably positioned as much as possible within the gap 65 between current bus legs 66 and 68. In the case of compensation bridge 30, half bridges 32 and 34 lie across the center line.

If it is necessary, in order to obtain the desired bridge resistance (which is related to the area of the bridge), for the half bridge sections to be too large to fit completely within gap 65, half bridge section 27 should partially overlie only incoming leg 66 while half bridge section 29 should partially overlie only outgoing leg 68. This helps improve rejection of common-mode electric fields.

In addition, Faraday shield (not shown) can be placed between half bridges 27 and 29 and the current bus to further improve rejection of common-mode electric fields.

Also as illustrated in FIG. 2, the polarity of response of each half bridge 27 and 29 to the given direction of magnetic field is the same, while the polarity of response of half bridge 32 of bridge 30 to a magnetic field in a given direction is opposite to that of bridge 34. (These differences are indicated by icons 25*a* and 25*b* in connection with measuring bridge 25 and icons 30*a* and 30*b* for compensation bridge 30.)

Figure 2A:
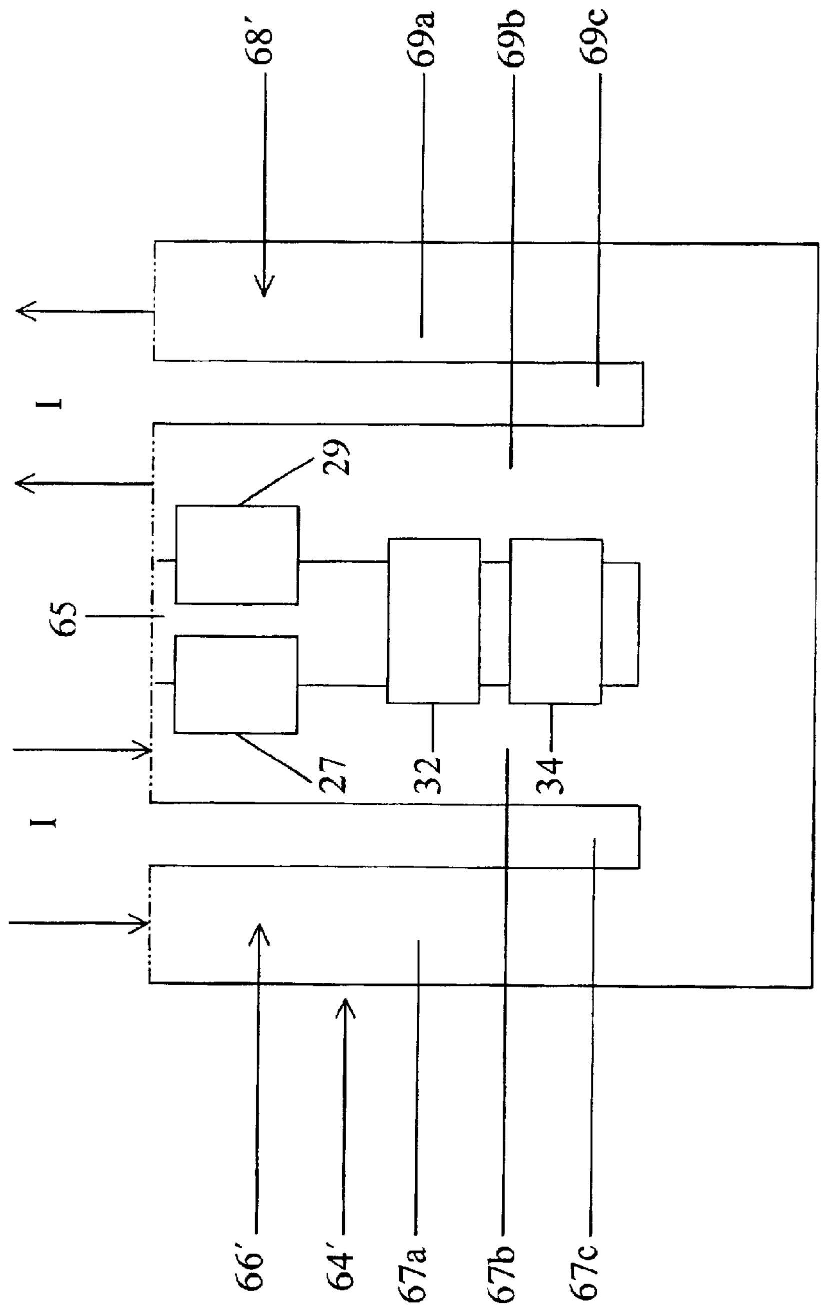
FIG. 2A shows an alternate construction for the measuring bus shown in FIG. 2.

FIG. 2A shows a variation of the bus configuration. Here, bus leg 64' has two legs 66' and 68' as before, but leg 66' is split into two parallel segments 67*a* and 67*b* separated by a small gap 67*c*. Similarly, bus leg 68' is split into two parallel segments 69*a* and 69*b* separated by a small gap 69*c*. Half bridges 27 and 29 of measuring bridge 25 are located side-by-side across gap 65 between bus legs 66' and 68', but overlie only split segments 67*b* and 69*b*. Again, it is preferred that half bridges 27 and 29 lie as much within gap 65 as possible, and to overlie respective bus legs 66' and 68' to the extent necessary to obtain the desired bridge resistance. Similarly, half bridges 32 and 34 of compensation bridge 30 are located axially along gap 65 between bus legs 66' and 68'. Again, these overlie only split segments 67*b* and 69*b*.

It is found that with the construction of FIG. 2A, the bus current divides between the split bus legs more evenly, and the current flow passing the measuring bridge is more uniform.

Referring again to FIG. 2 as the resistance of MR materials is known to vary directly according to the square of the cosine of the angle between an incident (in plane) magnetic field and the current flowing in the legs of the bridge, the desired polarity of response as indicated by icons 25*a*, etc., can be achieved by use of so-called "barber pole" biasing. According to this technique, conductive shorting strips are formed along the length of magnetoresistive strips, commonly at a 45 degree angle. This causes an effective net current vector due to the excitation voltage to be perpendicular to the shorting strips. By reversing the direction of the shorting strips in the legs of the two bridges as indicated by icons 25*a* and 25*b*, and 30*a* and 30*b*, the desired polarity reversals can be obtained.

Figure 3A:
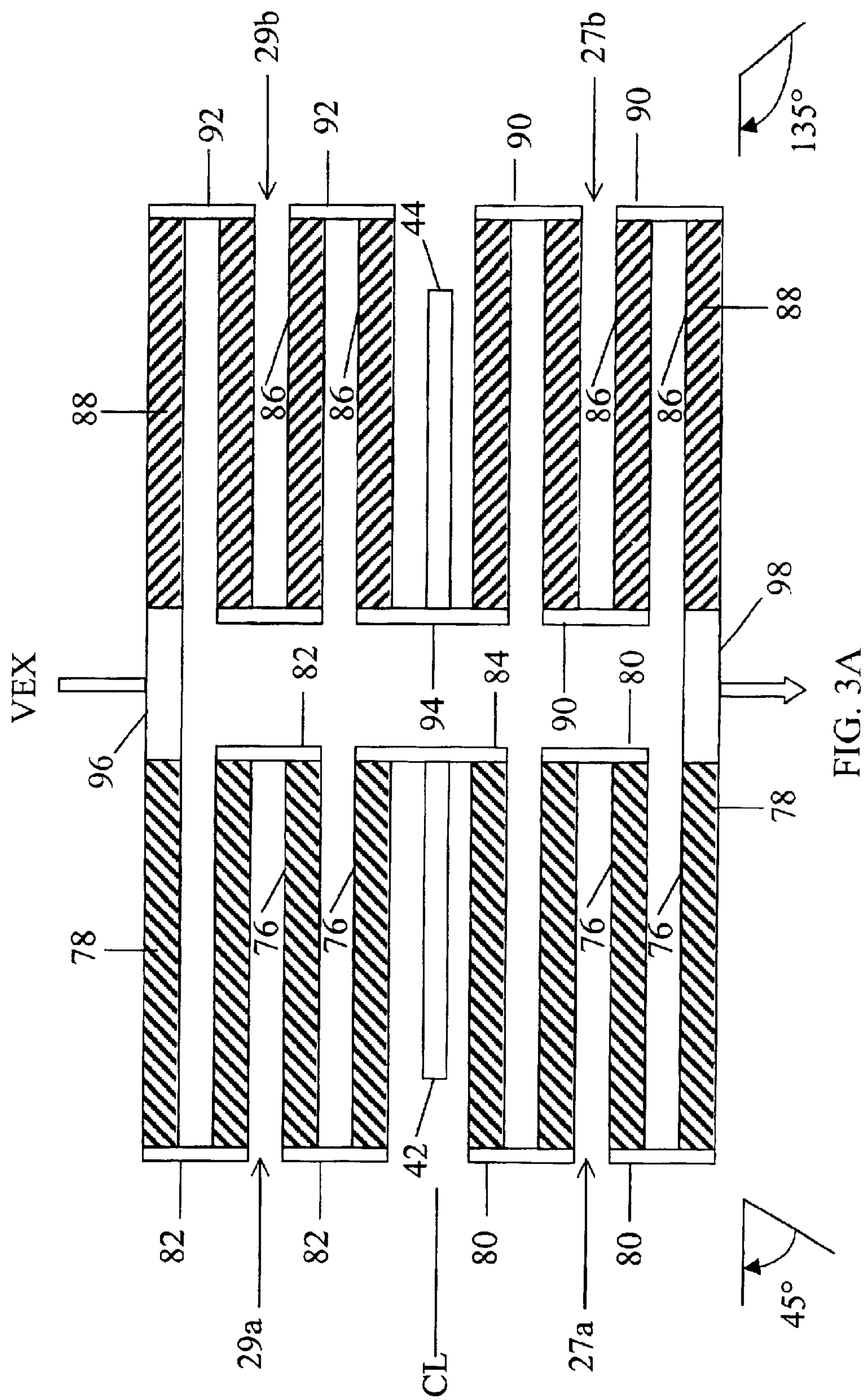
FIGS. 3A and 3B are schematic diagrams of the measuring bridge and one form of the compensation bridge, respectively.
Figure 3B:
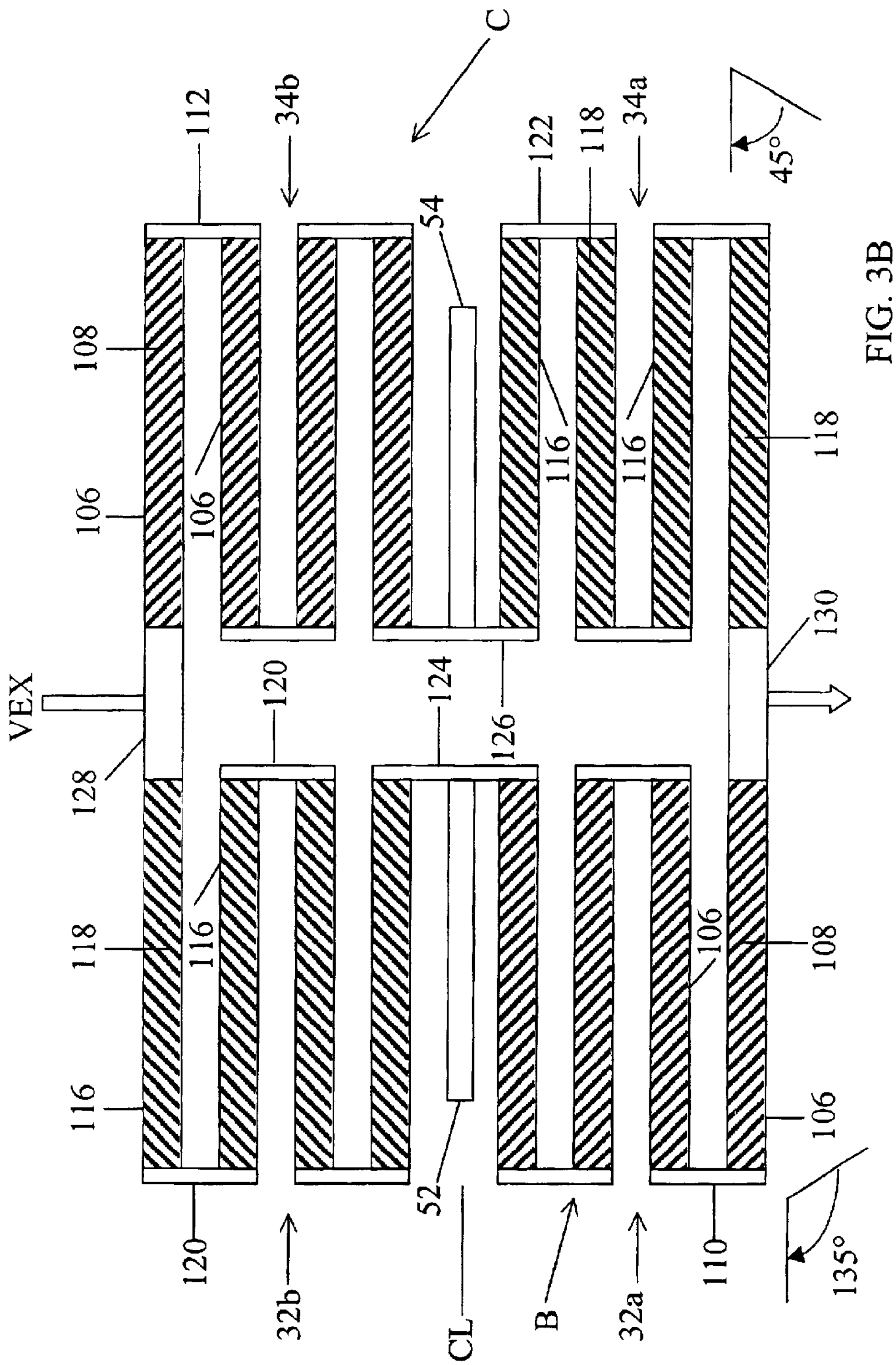

This is further illustrated in FIGS. 3A and 3B, which show the layouts of bridges 25 and 30. In FIG. 3A, legs 27*a* and 29*a* are each comprised of a series of magnetoresistive strips 76 with parallel shorting strips 78 spaced along the length thereof, and oriented at an angle of 45 degrees to center line CL. The magnetoresistive strips comprising leg 27*a* are connected together in serpentine fashion by bridging strips 80. Similarly, the magnetoresistive strips comprising leg 29*a* are connected together in serpentine fashion by bridging strips 82. The two legs are connected together by a bridging strip 84 to which output signal path 42 is also connected (see FIG. 1).

Still referring to FIG. 3A, legs 27*b* and 29*b* are each comprised of a series of magnetoresistive strips 86 with parallel shorting strips 88 spaced along the length thereof, and oriented at an angle of 135 degrees to center line CL. The magnetoresistive strips comprising leg 27*b* are connected together in serpentine fashion by bridging strips 90. Similarly, the magnetoresistive strips comprising leg 29*b* are connected together in serpentine fashion by bridging strips 92. The two legs are connected together by a bridging strip 94 to which output signal path 44 is also connected.

The excitation voltage Vex is applied by a bridging strip 96 which connects legs 29*a* and 29*b*, and the ground return is provided through a bridging strip 98 which connects legs 27*a* and 27*b*.

Referring now to FIG. 3B, legs 32*a* and 34*b* are each comprised of a series of magnetoresistive strips 106 with parallel shorting strips 108 spaced along the length thereof, and oriented at an angle of 135 degrees to center line CL. The magnetoresistive strips comprising leg 32*a* are connected together in serpentine fashion by bridging strips 110. Similarly, the magnetoresistive strips comprising leg 34*b* are connected together in serpentine fashion by bridging strips 112.

Still referring to FIG. 3B, legs 32*b* and 34*a* are each comprised of a series of magnetoresistive strips 116 with parallel shorting strips 118 spaced along the length thereof, and oriented at an angle of 45 degrees to center line CL. The magnetoresistive strips comprising leg 32*b* are connected together in serpentine fashion by bridging strips 120. Similarly, the magnetoresistive strips comprising leg 34*a* are connected together in serpentine fashion by bridging strips 122.

Legs 32*a* and 32*b* which form half bridge 32 are connected together by a bridging strip 124 to which output signal path 52 is also connected. Legs 34*a* and 34*b* which form half bridge 34 are connected together by a bridging strip 126 to which output signal path 54 is also connected. The excitation voltage Vex is applied by a bridging strip 128 which connects legs 32*b* and 34*b*, and the ground return is provided through a bridging strip 130 which connects legs 32*a* and 34*a*.

The structures illustrated in FIGS. 1, 2, 3A and 3B may be manufactured using conventional integrated circuit fabricating techniques, including patterned, etched, metal deposition on stable substrates such as silicon lead frame stamping to form the measuring bus sections and leadouts, adhesive bonding to assemble the lead frame to the chip substrate and the sensor element die to the lead frame, and plastic overmolding for encapsulation. Internal non-conductive layers and conductive elements such as bond pads and biasing coil 35 may also be fabricated conventionally using patterned, etched, metal deposition by various means.

Figure 4:
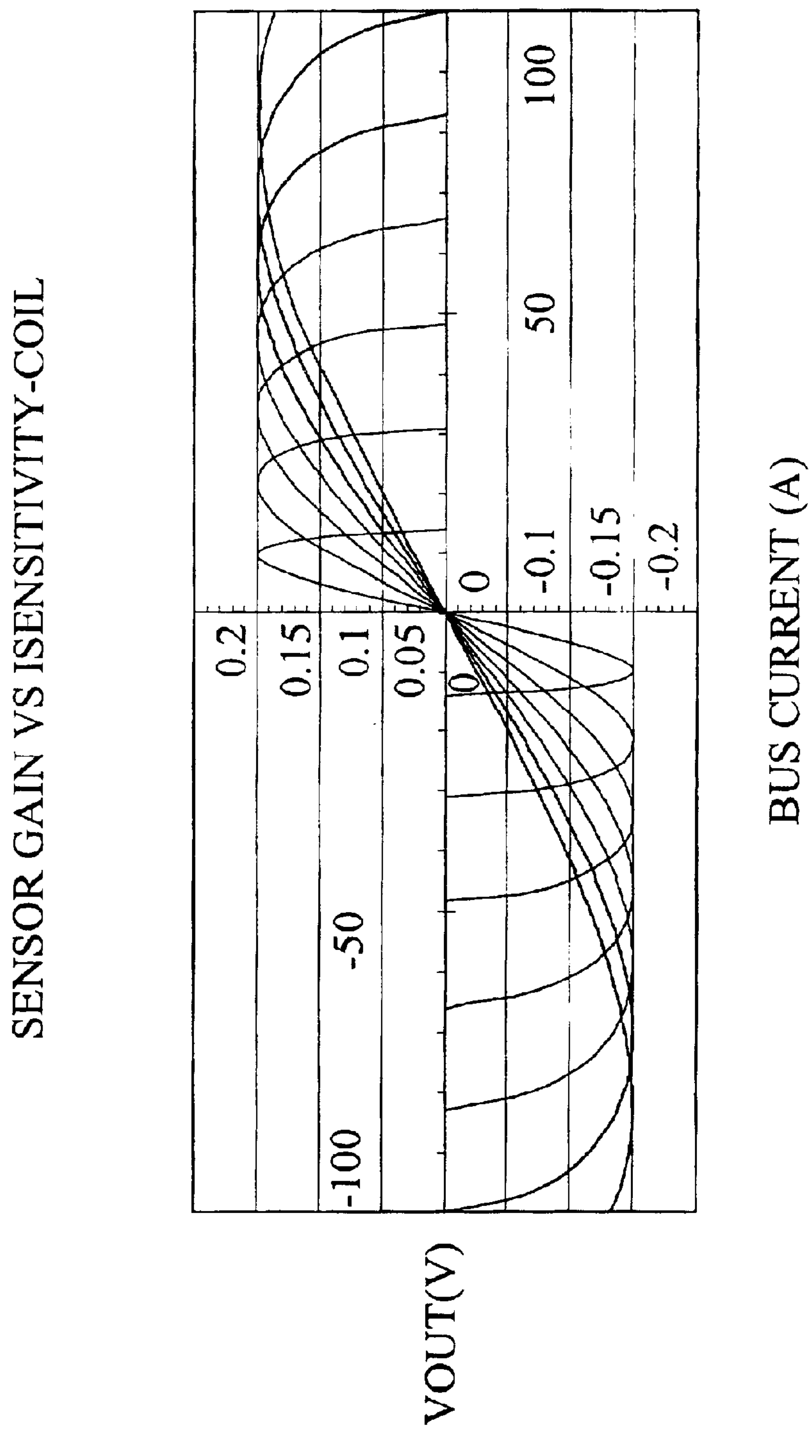
FIG. 4 shows how the sensitivity of the MR bridge varies with different levels of biasing current.

As previously mentioned, the magnetic field resulting from the current that flows through biasing coil 35 (see FIG. 1) can be used to control the sensitivity of response of the magnetoresistive bridge components and to provide temperature compensation. FIG. 4 illustrates bridge output voltage as a function of bus current for different bias levels. Curve A represents a low bias level, while curve B represents a high bias level. As may be seen, each bias level provides a transfer characteristic that is approximately linear over a limited current range. Thus, by employing different bias levels, linear transfer characteristics for a wide measurement range can be obtained.

The effective resistance of Permalloy material (and thus the sensitivity of response to magnetic fields) is also known to vary inversely with temperature. From FIG. 4, it may be seen that adjustment of the biasing field can also be used to provide temperature compensation.

Referring again to FIG. 1, according to this invention, the voltage output Vo from compensation bridge 30 (which is representative of the magnetic field of the biasing current), is used to provide closed loop control of the biasing current. To accomplish this, however, the configuration of biasing coil 35 and its placement relative to bridges 25 and 30 must be selected to assure that the biasing coil magnetic field is not "measured" as such, along with the bus current field, by bridge 25, and that it is measured by bridge 30.

Several possibilities exist for the configuration and placement of biasing coil 35, but in all instances, it is necessary for the biasing coil to cross the legs of measuring bridge 25 perpendicular to current bus 64 (see FIG. 2), and it is desirable for the biasing coil to cross the legs of the compensation bridge in a direction such that the biasing field is in the same direction as or orthogonal to the aggregate current vector of the bridge current in the respective legs. For barber pole biasing at 45 degrees as described above, the magnitude of the angle at which the biasing coil crosses the legs of compensation bridge 30 should be 45 degrees, with the direction depending on the orientation of the shorting strips.

It is also possible to omit the barber-pole shorting bars when fabricating bridge 30. This will shift the bias coil operating point and decrease the size of the bridge.

Figure 5:
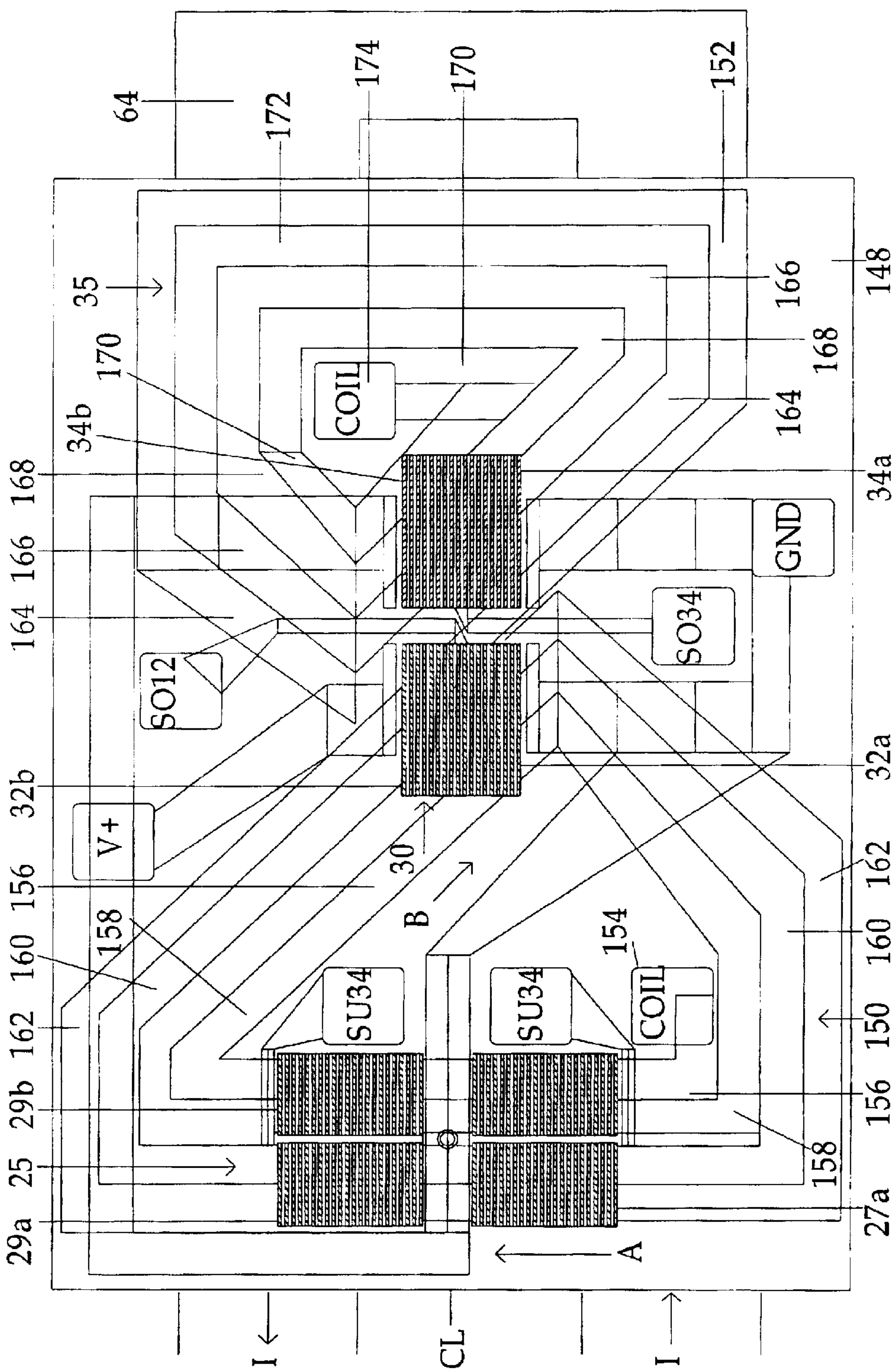
FIG. 5 shows a first preferred layout of the biasing coil relative to the bridges.

One suitable embodiment is shown in FIG. 5, which illustrates a layout of a monolithic sensor die including bridges 25 and 30, coil 35 and die substrate 148, as well as the relative positions of legs 66 and 68 of measuring bus 64 (see also FIG. 2).

Biasing coil 35 is comprised of two spirals 150 and 152. Considering biasing coil 35 as beginning at bond pad 154, a first turn 156 of spiral 150 crosses legs 27*b* and 29*b* of measuring bridge 25 a first time in the direction indicated by arrow A (parallel to the magnetic field of the bus current), then crosses leg 32*a* of compensation bridge 30 a first time in the direction indicated by arrow B. With reference to FIG. 3B, it may be seen that if coil 35 crosses bridge leg 32*a* in the direction of arrow B, the magnetic field of the bias current will be parallel to the net current vector of the bridge current.

A second turn 158 of spiral 150 then crosses legs 27*b* and 29*b* of measuring bridge 25 a second time in the A direction, and crosses legs 32*a* and 32*b* of half bridge 32 a second time in the B direction. Again, with reference to FIG. 3B, it may be seen that the magnetic field of the bias current will be parallel to the net current vector of the bridge current in bridge leg 32*a,* but will be orthogonal to the net current vector of the bridge current in bridge leg 32*b*.

A third turn 160 of spiral 150 now crosses legs 27*a* and 29*a* of measuring bridge 25 a first time in the A direction, and crosses half bridge legs 32*a* and 32*b* a third time in the B direction.

Again, the magnetic field of the bias current will be parallel to the net current vector of the bridge current in bridge leg 32*a,* but will be orthogonal to the net current vector of the bridge current in bridge leg 32*b*.

Finally, a fourth turn 162 of spiral 150 crosses legs 27*a* and 29*a* of measuring bridge 25 a second time in the A direction, and crosses bridge legs 32*a* and 32*b* a fifth time. In the illustrated layout, fourth turn 162 also crosses bridge leg 34*a* in the B direction. From FIG. 3B, it may be seen that the shorting strips in bridge legs 32*b* and 34*a* run in the same direction. Thus, for the portion of turn 162 that crosses leg 34*a,* the magnetic field of the bias current will be orthogonal to the net current vector of the bridge current.

Then, four turns 164, 166, 168 and 170 of a second spiral 172 cross half bridge 34 four times without crossing bridge 25. The first turn 164 of spiral 172 also crosses bridge leg 32*b.* Coil 35 then terminates at bond pad 174.

To summarize, in FIG. 5, with the barber pole shorting strips oriented as illustrated, the magnetic field of the biasing current crosses legs 27*a* and 29*a* of measuring bridge 25 in a first direction relative to the bridge current, and crosses legs 27*b* and 29*b* in a second opposite direction. Also, the magnetic field of the biasing current crosses legs 32*a* and 34*b* of compensation bridge 30 parallel to the net current vector, and crosses legs 32*b* and 34*a* of bridge 30 orthogonal to the net current vector. In this arrangement, compensation bridge 30 is quite insensitive to the magnetic fields of the bus current.

Figure 6:
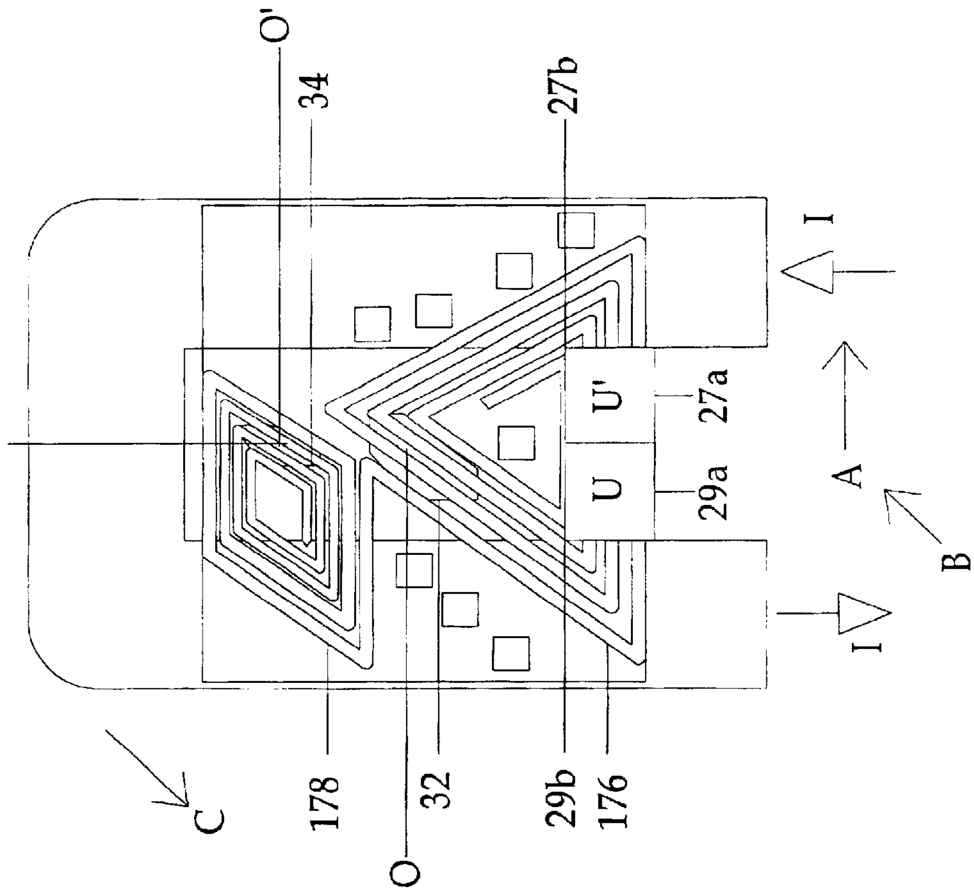
FIG. 6 shows a second preferred layout of the biasing coil relative to the bridges.

If greater insensitivity to stray magnetic fields is desired, a configuration such as illustrated in FIG. 6 may be employed. Here, a first spiral 176 of the biasing coil crosses measuring bridge 25 and half bridge 32 of compensation bridge 30 in the same manner, i.e., in respective directions A and B, as described in connection with FIG. 5, but a second spiral 178 crosses half bridge 34 in the direction indicated by arrow C, which is opposite to that of arrow B. As a consequence, the magnetic field of the bias current crosses leg 34*a* parallel to the current vector in bridge 30, and crosses leg 34*b* orthogonal to the current vector (see FIG. 3B). In this configuration, bridge 30 is quite resistant to the effects of stray magnetic fields, but somewhat less resistant to the effect of the bus current field.

Figures 7A, 7C, 7D:
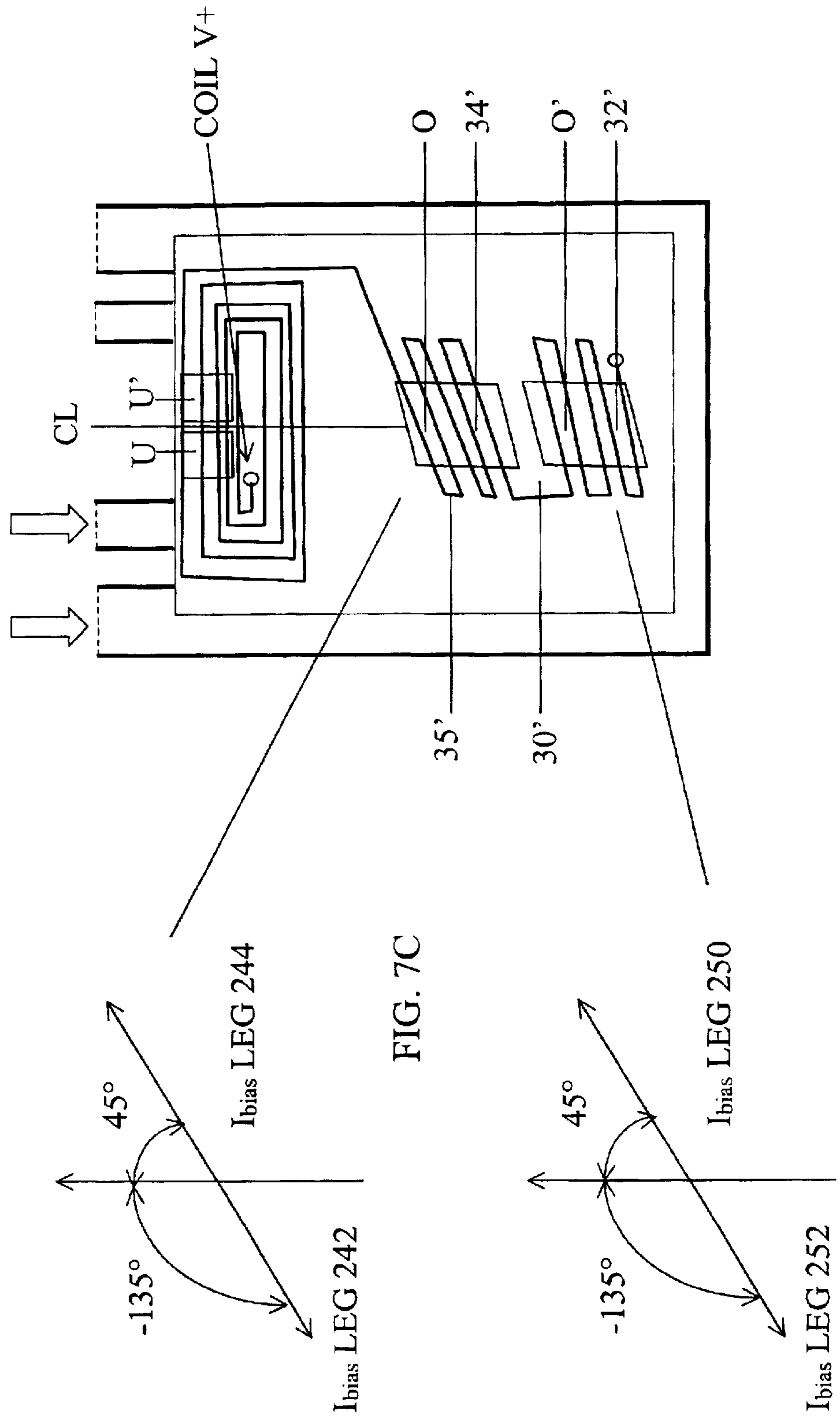
FIGS. 7A–7D show a third preferred layout of the biasing coil relative to the bridges, and a second preferred construction for the compensation bridge.
Figure 7B:
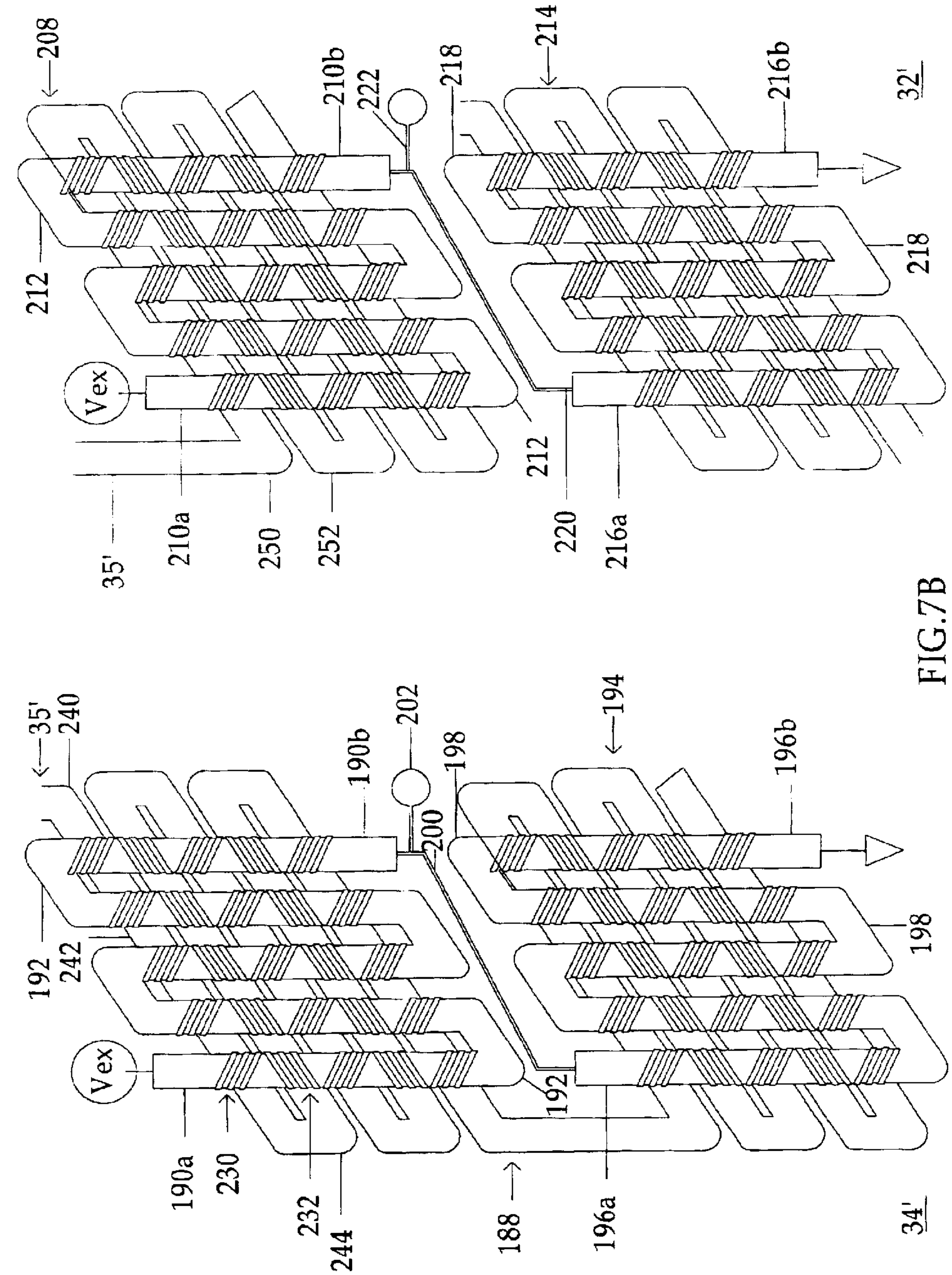

In the embodiment of FIGS. 7A and 7B, the compensation bridge exhibits excellent resistance stray magnetic fields, and also to the bus current field. Here, biasing coil 35 crosses measuring bridge 25 in the same manner as previously described, biasing coil 35 crosses compensation bridge 30 in a serpentine fashion, instead of spirally, as in the previous embodiments.

As illustrated in FIG. 7, the four legs comprising bridge 30 are axially aligned along center line CL. Thus, upper half bridge 34 is comprised of a first leg 188 including a plurality of parallel magnetoresistive strips 190*a,* 190*b,* etc., connected by bridging strips 192, and a second leg 194 including four parallel magnetoresistive strips 196*a,* 196*b,* etc., connected by bridging strips 198. The two legs are joined by a connecting strip 200, to which an output signal path is also connected.

Lower half bridge 32' is comprised of a first leg 208 including four parallel magnetoresistive strips 210*a,* 210*b,* etc., connected by bridging strips 212, and a second leg 214 including four parallel magnetoresistive strips 216*a,* 216*b,* etc., connected by bridging strips 218. The two legs are joined by a connecting strip 220, to which an output signal path 222 is also connected.

The excitation voltage Vex is provided in common to legs 188 and 194 at the free ends of magnetoresistive strips 190*a* and 210*a,* and a common ground return is provided to legs 196 and 216 at the free ends of magnetoresistive strips 196*b* and 216*b*.

The shorting strips are also laid out quite differently than in the previous embodiments. Considering, for example, the shorting strips for magnetoresistive strip 190*a,* a first group 230 of three shorting strips are oriented at a 135 degree angle to the length of the magnetoresistive strip, followed by a second group 232 of three shorting strips oriented at a 45 degree angle to the length of the magnetoresistive strip. This alternating pattern is continued for the length of strip 190*a* with the total number of groups 230, 232 of shorting strips being equal to the number of turns of biasing coil 35 which cross the bridge leg 188. Each of the strips comprising bridge 30 is laid out exactly the same as strip 190*a*.

Each leg is shown having four magnetoresistive strips, and each strip is shown having three shorting strips in each group, but obviously, different numbers may be provided.

As previously mentioned, the bias coil crosses bridge 30' in a serpentine fashion. Thus, coil 35' is shown crossing each leg of half bridge 34' five times in alternating directions, and also crossing each leg of half bridge 32' five times in alternating directions. Considering the entry point for the biasing coil to be at 240, and with reference to FIG. 7C, the biasing current in the first coil leg 242 is at an angle of −135 degrees relative to center line CL. In the second coil leg 244, the current is in the opposite direction, i.e., at an angle of 45 degrees relative to the center line. This alternating pattern is continued for the eight remaining crossings of half bridge 34' by coil 35'.

For half bridge 32', the crossing directions of biasing coil 35' are reversed from that of half bridge 34'. Thus, as shown in FIG. 7D, the biasing current in the first coil leg 250 on half bridge 32' is at an angle of 45 degrees relative to center line CL. In the second coil leg 252, the current is in the opposite direction, i.e., at an angle of −135 degrees relative to the center line. This alternating pattern is continued for the eight remaining crossings of half bridge 32' by coil 35'.

Figure 8:
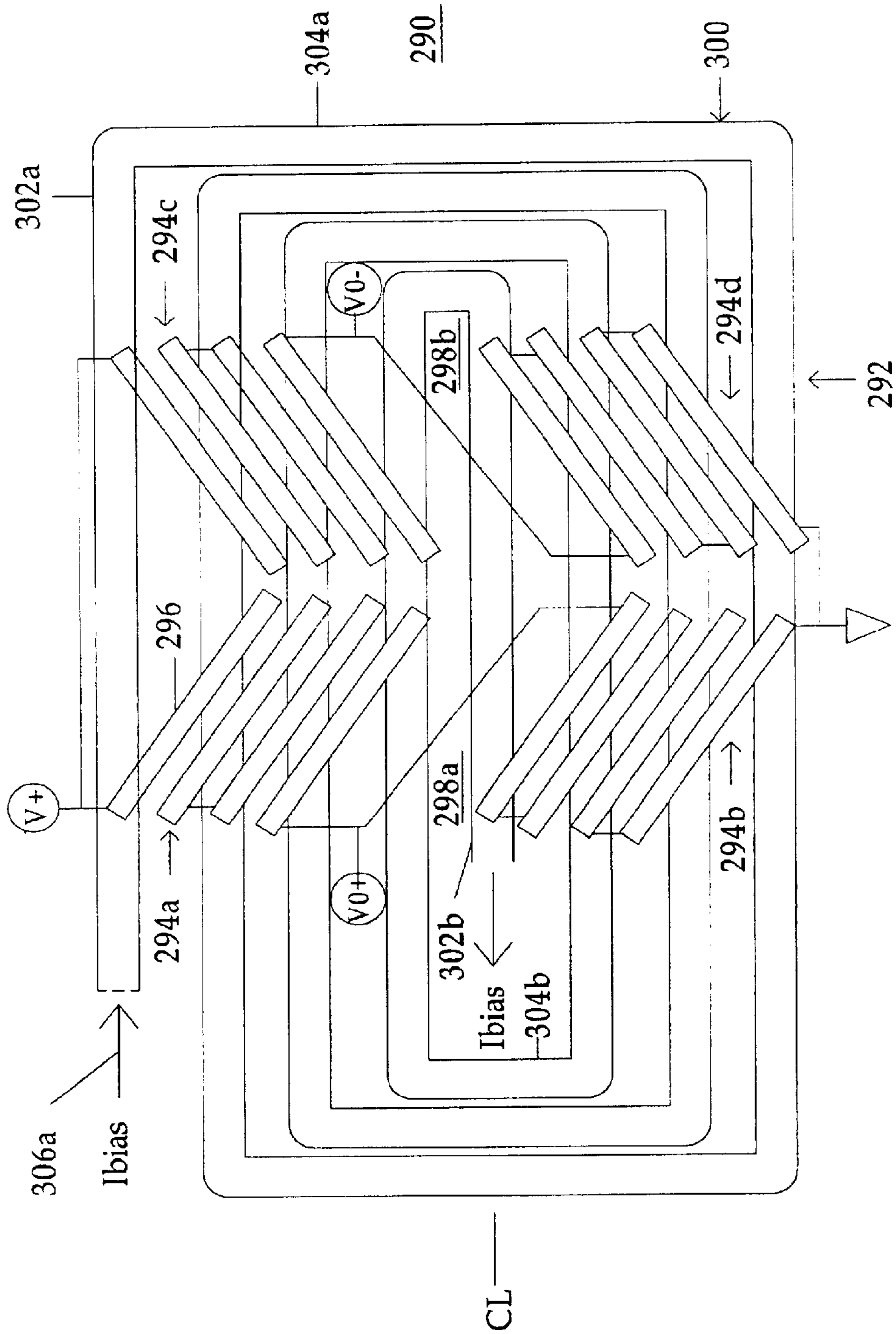
FIG. 8 shows a herringbone layout for the compensation bridge which does not employ barber pole shorting strips.

In FIG. 8, there is shown an alternative configuration for the compensation bridge, generally denoted at 290, which does not require shorting strips. Compensation bridge 292 is formed of four legs 294*a*–294*d*, each formed of a plurality of like magnetoresistive strips 296 connected together in serpentine fashion. Legs 294*a* and 294*b* are disposed across center line CL from each other and connected together to form a first half bridge 298*a*. Similarly, legs 294*c* and 294*d* are disposed across center line CL from each other and connected together to form a second half bridge 298*b*. The layout corresponds to that shown in FIG. 2.

The excitation voltage V+ is provided between half bridges 298*a* and 298*b*. Bridge output voltage Vo+ is provided between legs 294*a* and 294*b*, and output voltage Vo− is obtained between legs 294*c* and 294*d*.

a spiral biasing coil 300 is laid out with a plurality of turns 302*a*, 302*b*, etc., lying parallel to center line CL, and a plurality of turns 304*a*, 304*b*, etc. lying transverse to center line CL. The bias current enters biasing coil 330 at 306*a*, and exits at 306*b*. The left ends of transverse turns 304 overlie the measuring bridge (not shown) in the manner indicated in FIGS. 5–7.

As indicated, shorting strips are not employed on compensation bridge 292. Instead, the MR strips of legs 294*a* and 294*b* are laid out relative to biasing coil 300 so that legs 294*a* and 294*b* are at an angle of −45 degrees, while legs 294*c* and 294*d* are at an angle of −135 degrees.

As is known, the magnetic domains of strips 294 can be aligned in a preferred direction by an annealing process in which the strips are heated to a temperature which is characteristic of the material, and a strong magnetic field is applied. In the embodiment shown in FIG. 8, the so-called EZ axis is at a 45 degree angle to the strips 296, and is therefore in the same or the reverse direction as the bias current.

The interaction of the bridge excitation current and magnetic field of the bias current tends to rotate the magnetic domains of the MR strip toward the bias field. Thus, with the resistance being a function of square of the cosine of the angle between the bias field and the bridge current, opposite alignments of the bias current and the EZ axis will rotate the magnetic domains in opposite directions, thus alternatingly increase and decrease the resistance.

Figure 9:
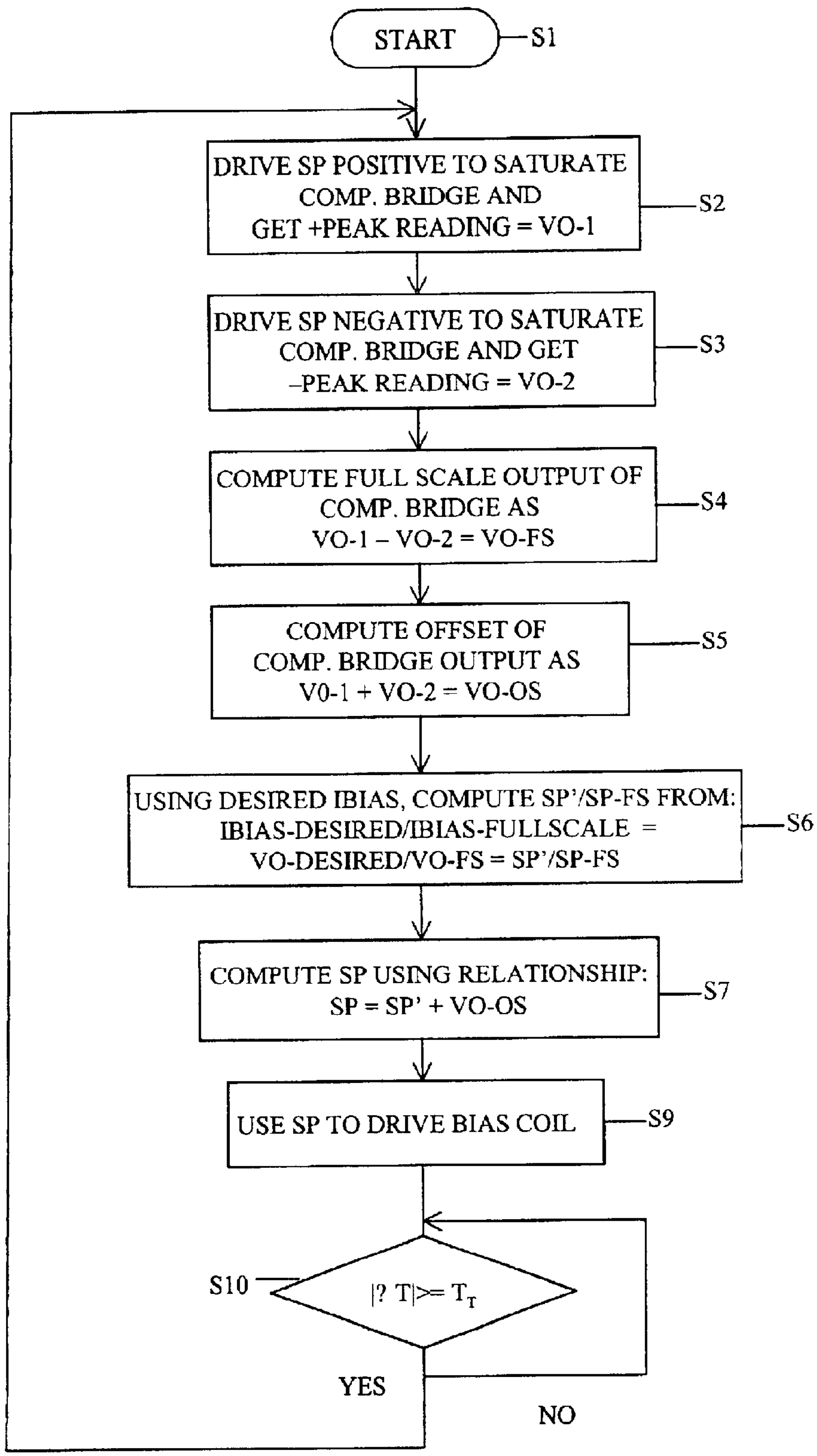
FIG. 9 is a flow diagram showing the steps involved in providing closed loop sensitivity control for the measuring bridge using the compensation bridge output voltage.

FIG. 9 illustrates a flow diagram of one preferred signal processing technique for obtaining closed loop temp compensation and bias current control. FIG. 8A illustrates the transfer characteristic (Vo vs. Ibias) for bridge 30. It should be understood that these processing tasks are done either by a processor or integrated with sensor+signal conditioning on an application specific integrated circuit (ASIC) chip.

Figure 9A:
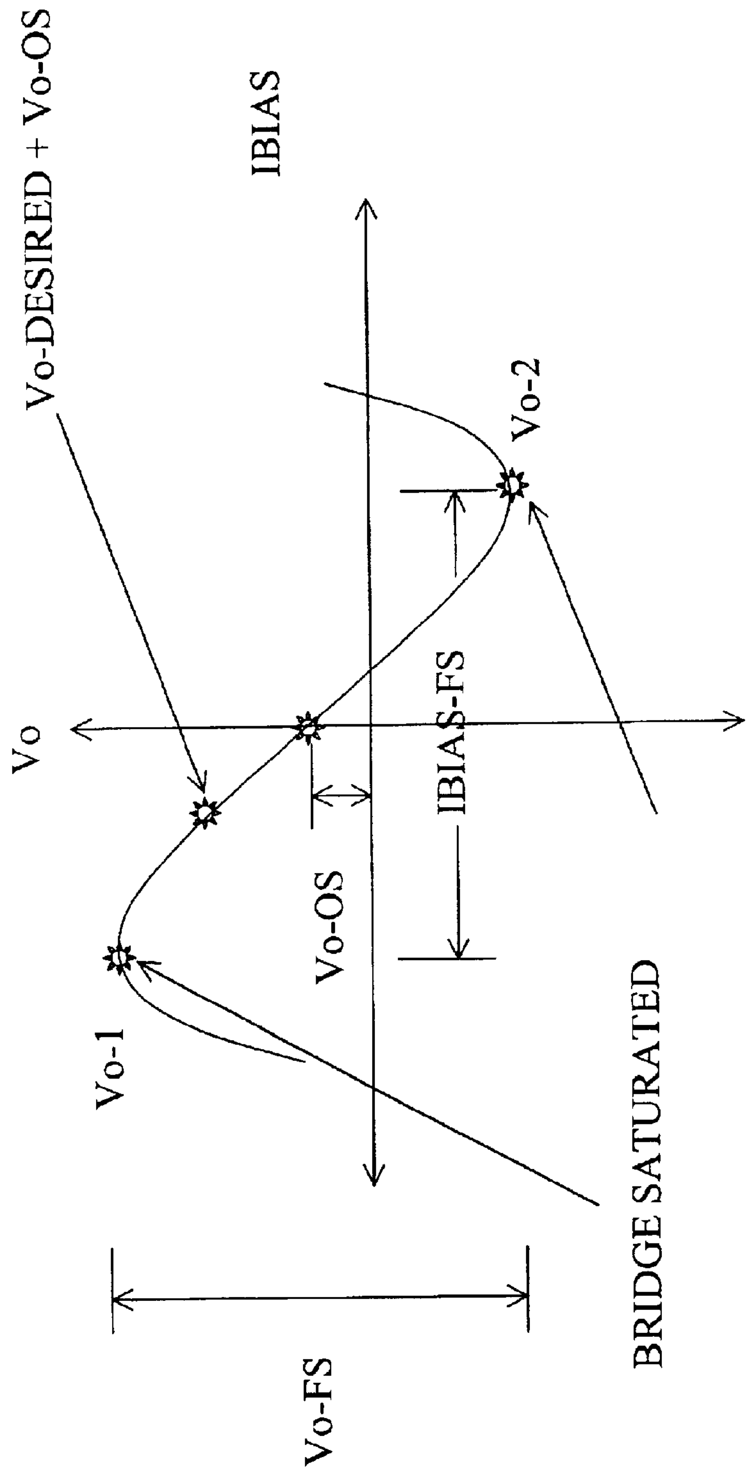
FIG. 9A shows a plot of voltage output of the compensation bridge as a function of the bias current.

The process begins at system startup (step S1) as an initial calibration. Referring to FIGS. 1, 9, and 9A, the first calibration step is to drive the set point signal SP for coil drive 50 on signal path 56 sufficiently high (e.g., to system V+) to saturate compensation bridge 30 and to obtain a +Peak reading=Vo-1 at the output of differential amplifier 45 (step S2).

Next, the set point signal SP is driven sufficiently negative (e.g., to system V−) to saturate bridge 30 in the opposite direction and to obtain a −Peak reading=Vo-2 at the output of differential amplifier 45 (step S3). These are shown in FIG. 9A.

Next, the full scale output of bridge 30 is computed (step S4) according to the relationship:

$$Vo\text{-}1-Vo\text{-}2=Vo\text{-}fs. \quad (1)$$

Next, the bridge offset Vo-os as indicated FIG. 9A is computed (step S5) according to the relationship:

$$Vo\text{-}1+Vo\text{-}2=Vo\text{-}os. \quad (2)$$

Next, knowing the desired gain as indicated by the transfer characteristics of the measuring bridge 25 shown in FIG. 4, and therefore, the corresponding bias current, at step S6, the desired operating point Vo-desired is determined according to the relationship:

$$\text{Ibias-desired/Ibias-fullscale}=Vo\text{-desired}/Vo\text{-}fs. \quad (3)$$

Also, at step S6, assuming the characteristic of SP vs Vu-fs (Sensor Gain) is ratiometric to Ibias vs Vu-fs, the value SP' (un-offset compensated SetPoint) is determined according to the relationship:

$$SP'/SP\text{-}fs=(Vo\text{-desired})/Vo\text{-}fs. \quad (4)$$

Now, at step S7, the measured offset Vo-os is used to obtain the offset compensated set point for coil drive 50 according to the relationship:

$$SP=SP'+Vo\text{-}os(Vo\text{-}fs/Sp\text{-}fs) \quad (5)$$

The set point computed in this manner can be used to drive the coil continuously while measuring the bus current using the output of differential amplifier 40 (step S8). Re-calibration and temperature compensation of the bias current only needs to be done as temperature changes significantly, or at startup/from unknown state.

Thus, as indicated at step S9, a temperature sensor 55 can be used to initiate a re-calibration when the change in ambient temperature equals or exceeds a predetermined threshold.

By making the output of bridge 30 insensitive to stray fields and to the bus current fields according to the various embodiments described above in connection with FIGS. 5–8, change in sensor gain is effectively determined by changes in Vo, while Ibias is held steady. Thus, "closed loop" feedback control of measuring bridge gain is obtained. As will be appreciated, temperature sensor 55 allows measurement of the effects to temperature alone.

Figure 10:
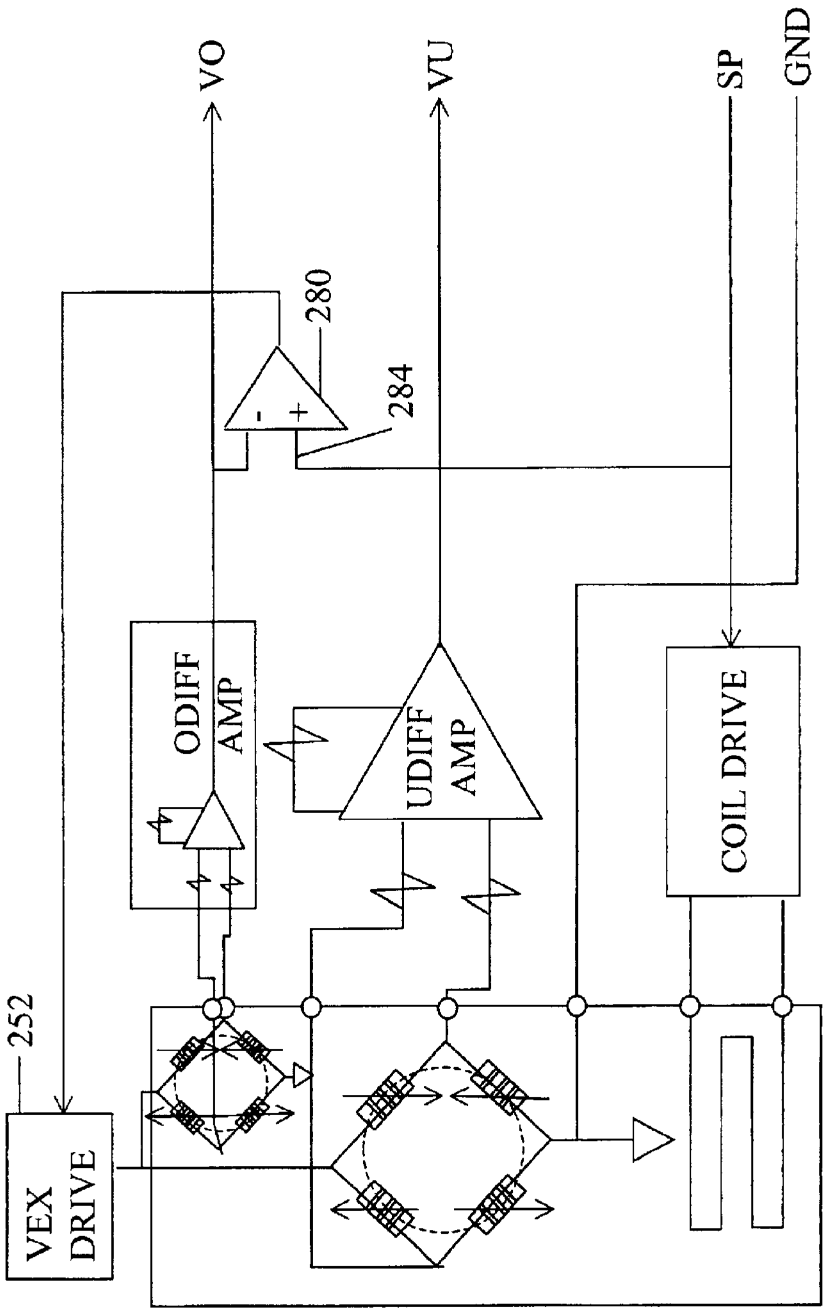
FIG. 10 is an electrical schematic diagram of an alternative embodiment which can be used to provide closed loop temperature compensation.

It is found that the compensation bridge transfer characteristic SP' vs Vo is inverse to the measuring bridge transfer characteristic SP' vs Vu. This information can be used to provide temperature compensation as shown in FIG. 10, where the output Vo from compensation bridge 30 is also used as an input to a further differential amplifier 280 to control an excitation drive circuit 282 which provides the excitation voltage Vex for both bridges 25 and 30. Here, the set point signal SP is used as a second input at 284 to differential amplifier 280 to establish a desired operating point for the excitation voltage, and, as previously described, for the bias current. As a further alternative, the excitation voltage Vex can also be controlled by a constant control voltage Vref provided at differential amplifier input 284.

Figure 11:
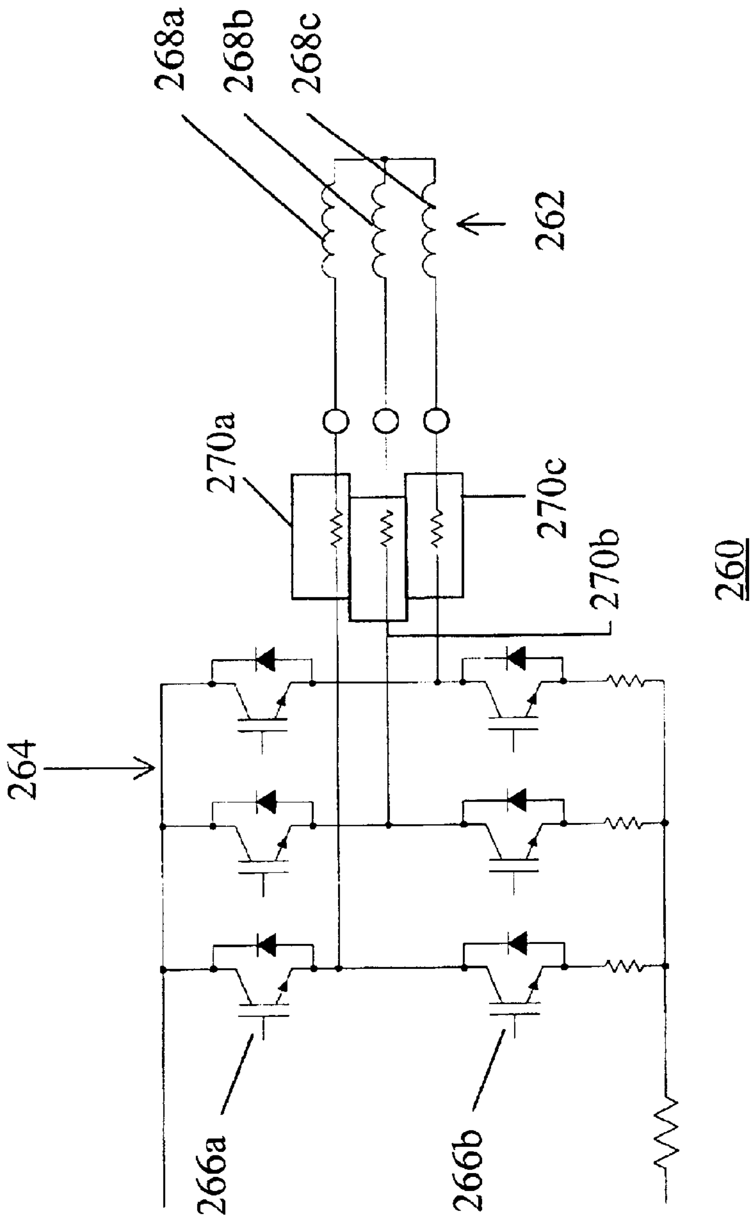
FIG. 11 is a schematic diagram of a motor control system utilizing the magnetic field sensor according to this invention.

Turning now to FIG. 11, there is shown a simplified diagram of a motor control system, generally denoted at 260. Here, a three phase motor 262 is driven by a semiconductor driver, for example a PWM system employing switches 266*a* and 266*b* for phase 268*a,* and a similar switch arrangement for phases 268*b* and 268*c.* A gate control circuit (not shown) for switches 266 may be provided in any desired or conventional manner.

Using current sensors 270*a–c* as described above, the Vu outputs of the measuring bridges, a feedback signal is provided to the gate control circuit. This is used to provide closed loop control of the motor current.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a bus section connectable into the path of the electric current, the first MR bridge being oriented to be sensitive to the magnetic field of a current in the bus section;

the second MR bridge being oriented to be substantially insensitive to the magnetic field of a current in the bus section; and a signal processing device responsive to a voltage output of the second MR bridge to control the current through the biasing coil, wherein:

the bus section is comprised of two parallel legs on opposite sides of a center line, the legs being connected together at respective first ends and connectable at respective second ends into the path of the electric current; and the first MR bridge is comprised of two half-bridge sections positioned symmetrically relative to the center line between the legs of the bus section.

2. A magnetic field measuring device as described in claim 1, wherein: each leg of the bus section is split into two spaced segments parallel to the center line with the first MR bridge located substantially in the space between the two segments, and at most partially overlying only the segments of the respective legs closest to the center line.

3. A magnetic field measuring device as described in claim 1, wherein:

the legs are connected at the respective first ends by a segment disposed transverse to the center line.

4. A measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a signal processing device responsive to a voltage output of the second MR bridge to control the current through the biasing coil, a bus section connectable into the path of the electric current, the first MR bridge being oriented to be sensitive to the magnetic field of a current in the bus section;

the second MR bridge being oriented to be substantially insensitive to the magnetic field of a current in the bus section, wherein the biasing coil either:

A. traverses the first MR bridge parallel to the magnetic field of the current being measured, and traverses the second MR bridge in a direction such that the magnetic field of the bias current is one of:

(a) parallel to a net current vector of a current flowing the in second MR bridge;

(b) orthogonal to a net current vector of a current flowing the in second MR bridge; and (c) at an angle of 45 degrees with respect to the current flowing the in second MR bridge; or B. traverses the first MR bridge at 90 degrees relative to the bus, and traverses the second MR bridge in a direction such that the magnetic field of the bias current is one of:

(a) parallel to the net current vector of a current flowing in the second MR bridge; and (b) orthogonal to the net current vector of a current flowing in the second MR bridge.

5. A measuring device for a magnetic field associated with an electronic current comprising:

a first MR bridge oriented to be sensitive to the magnetic field to be measured;

a second MR bridge oriented to be substantially insensitive to the magnetic field to be measured;

a baising coil configured and positioned to apply a magnetic field to the first and second MR bridges, whereby the sensitivity of the first MR bridge can be controlled;

a signal processing device responsive to a voltage output of the second MR bridge to control the current through the biasing coil.

a bus section connectable into the path of the electric current, the first MR bridge being oriented to be sensitive to the magnetic field of a current in the bus section;

the second MR bridge being oriented to be substantially insensitive to the magnetic field of a current in the bus station, wherein the first and second MR bridges are each comprised of:

first and second pluralities of side-by-side thin film strips of MR material connected together, and extending parallel to the bus on a first side of a centerline of the bus, the second plurality of strips being spaced along the bus from the first plurality of strips;

a third and fourth pluralities of side-by-side thin film strips of MR connected together, and extending parallel to the bus on a second side of the centerline, and substantially across the center line from the first and second pluralities of strips, respectively; and wherein:

the first and second pluralities of MR strips of the first MR bridge are connected to form a first half Wheatstone bridge, with a first measurement terminal therebetween;

the third and fourth pluralities of MR strips of the first MR bridge are connected to form a second half Wheatstone bridge, with a second measurement terminal therebetween;

the first and second half Wheatstone bridges are connected together to form a first full Wheatstone bridge with excitation terminals at the points of connection between the half bridges;

the first and third pluralities of MR strips of the second MR bridge are connected in to form a third half Wheatstone bridge, with a third measurement terminal therebetween;

the second and fourth pluralities of MR strips of the second MR bridge are connected in a series to form a fourth half Wheatstone bridge, with a fourth measurement terminal therebetween; and the third and fourth half Wheatstone bridges are connected together to form a second full Wheatstone bridge with excitation terminals at the points of connection between the half bridges.

6. A magnetic field measuring device as described in claim 5, further including a plurality of relatively narrow electrically conductive shorting strips disposed in a barber-pole configuration across each of the MR strips of the first MR bridge, and wherein:

the shorting strips across the first and third MR strips of the first MR bridge lie at a first acute angle relative to the centerline of the bus; and the shorting strips across the second and fourth MR strips of the first MR bridge lie at a second acute angle relative to the centerline of the bus.

7. A magnetic field measuring device as described in claim 6, wherein the first and second acute angles are respectively equal and opposite.

8. A magnetic field measuring device as described in claim 6, wherein the magnitudes of the first and second acute angles are equal to 45 degrees.

9. A magnetic field measuring device as described in claim 6, wherein the MR strips comprising the second MR bridge do not include shorting strips, and is laid out in a herringbone pattern.

10. A magnetic field measuring device as described in claim 6, further including:

a plurality of relatively narrow electrically conductive shorting strips disposed in a barber-pole configuration across each of the MR strips of the second MR bridge, and wherein:

the shorting strips across the first and fourth MR strips of the second MR bridge lie at a third acute angle relative to the centerline of the bus, and the shorting strips across the second and third MR strips of the second MR bridge lie at a fourth acute angle relative to the centerline of the bus.

11. A magnetic field measuring device as described in claim 10, wherein the third and fourth acute angles are respectively equal and opposite.

12. A magnetic field measuring device as described in claim 11, wherein the magnitudes of the third and fourth acute angles are equal to 45 degrees.

13. A magnetic field measuring device as described in claim 12, wherein the biasing coil crosses the second MR bridge at a 45 degree angle to the center line of the bus.

14. A magnetic field measuring device as described in claim 6, wherein the biasing coil crosses the first MR bridge perpendicular to the center line of the bus.

15. A magnetic field measuring device as described in claim 5, wherein: the biasing coil crosses the first MR bridge perpendicular to the center line of the bus; and the biasing coil crosses the second MR bridge such that the magnetic field of the biasing current is parallel or perpendicular to the net current vector of the bridge current.

16. A measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a signal processing device responsive to a voltage output of the second MR bridge to control the current through the biasing coil, a bus section connectable into the path of the electric current, the first MR bridge being oriented to be sensitive to the magnetic field of a current in the bus section;

the second MR bridge being oriented to be substantially insensitive to the magnetic field of a current in the bus section, wherein:

the biasing coil is comprised one of:

A. a spiral section which crosses the first MR bridge a plurality of times in the same direction;

B. (a) a first spiral which crosses the first MR bridge and one of the half bridges of the second MR bridge a plurality of times; and (b) a second spiral that crosses the other half bridge of the second MR bridge a plurality of times;

C. (a) a first spiral which crosses the first MR bridge a plurality of times in a first direction, and crosses one of the half bridges of the second MR element a plurality of times in a second opposite direction; and (b) a second spiral which crosses the second half bridge of the second MR bridge a plurality of times in the second direction;

D. (a) a spiral which crosses the first MR bridge a plurality of times in the same direction; and (b) a serpentine section which crosses the second MR bridge a plurality of times in succession in alternating directions;

E. (a) a spiral which crosses the first MR bridge a plurality of times in the same direction; and (b) a serpentine section which crosses a first half bridge of the second MR bridge a plurality of times in succession in alternating directions, and then crosses a second half bridge of the second MR bridge a plurality of times in succession; and F. (a) a spiral which crosses the first MR bridge a plurality of times in the same direction; and (b) a serpentine section which crosses a first half bridge of the second MR bridge a plurality of times in succession in alternating directions, and then crosses a second half bridge of the second MR bridge a plurality of times in succession, (i) the first crossing of the first half bridge by the serpentine section being in a first direction; and (ii) the first crossing of the second half bridge by the serpentine section being in a second direction.

17. A magnetic measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a signal processing device responsive to a voltage output of the second MR bridge to control the current through the biasing coil, a bus section connectable into the path of the electric current, the first MR bridge being oriented to be sensitive to the magnetic field of a current in the bus section;

the second MR bridge being oriented to be substantially insensitive to the magnetic field of a current in the bus section, first and second differential amplifiers, the inputs of which are respectively connected to the measuring terminals of the first and second MR bridges; and a driver circuit for the biasing coil.

18. A magnetic field measuring device as described in claim 17, further including a calibration circuit that controls the driver circuit.

19. A magnetic field measuring device as described in claim 18, wherein the calibration circuit is responsive to changes in ambient temperature to control an operating point for the driver circuit.

20. A magnetic field measuring device as described in claim 18, wherein the calibration circuit is responsive to changes in an output signal from the second differential amplifier to provide closed-loop control of an operating point for the driver circuit.

21. A measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a signal processing device responsive to a voltage output of the second MR bridge to control the current through the biasing coil, a bus section connectable into the path of the electric current, the first MR bridge being oriented to be sensitive to the magnetic field of a current in the bus section;

the second MR bridge being oriented to be substantially insensitive to the magnetic field of a current in the bus section, wherein:

the first MR bridge has a greater sensitivity to a magnetic field of a given amplitude than the second MR bridge.

22. A measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a signal processing device responsive to a voltage output of the second MR bridge to control the current through the biasing coil, a bus section connectable into the path of the electric current, the first MR bridge being oriented to be sensitive to the magnetic field of a current in the bus section;

the second MR bridge being oriented to be substantially insensitive to the magnetic field of a current in the bus section, wherein:

the second MR bridge is comprised of four groups of parallel side-by-side strips, with the strips of each group connected together to form one leg of a Wheatstone bridge;

each of the strips including first and second pluralities of groups shorting strips thereon in a barber pole configuration, with the first and second groups being disposed on the MR strips in alternating fashion;

the shorting strips in a first group all lie at a first angle relative to the length of the MR strip; and the shorting strips in the second group all lie at a second angle which is equal and opposite to the first angle.

23. A magnetic field measuring device as described in claim 22, wherein:

the legs of the second MR bridge are spaced axially along a center line of the current bus section; and the biasing coil is comprised of a serpentine section which crosses each leg of the second MR bridge a plurality of times in succession in alternating opposite directions, the number of crossings of each leg of the second the MR bridge by the biasing coil groups being equal to the total number groups of shorting strips on each leg.

24. A magnetic field measuring device as described in claim 23, wherein: the direction in which the biasing coil crosses the legs of the second MR bridge, and the layout of the shorting strips is such that the magnetic field of the biasing current is alternatingly parallel or orthogonal to the bridge current.

25. A magnetic field measuring device as described in claim 23, wherein the last crossing of the second leg of second MR bridge by the biasing is in the same direction as the first crossing of the third leg.

26. A measuring device for a magnetic field associated with an electric current comprising:

a first MR bridge oriented to be sensitive to the magnetic field to be measured;

a second MR bridge oriented to be substantially insensitive to the magnetic field to be measured;

a biasing coil configured and positioned to apply a magnetic field to the first and second MR bridges, whereby the sensitivity of the first MR bridge can be controlled;

a signal processing device responsive to a voltage output of the second MR bridge to control the current through the biasing coil, a bus section connectable into the path of the electric current, the first MR bridge being oriented to be sensitive to the magnetic field of a current in the bus section;

the second MR bridge being oriented to be substantially insensitive to the magnetic field of a current in the bus section, wherein:

the signal processing device comprises a programmed circuit calibration circuit that:

operates the biasing coil driver to saturate the second MR bridge in a second opposite direction;

computes a full scale output of the second MR bridge according to the difference between the saturation-level outputs of the second MR bridge;

computes bridge offset level according to the sum of the saturation-level outputs of the second MR bridge;

determines a desired output operating point Vo-desired for the second MR bridge according to the relationship:

$$\text{Ibias-desired}/\text{Ibias-fullscale}=Vo\text{-desired}/Vo\text{-}fs$$

where Ibias-desired is a value corresponding to Vo-desired, Ibias-full scale is the difference between the bias currents for the two directions of saturation, and Vo-fs is the full-scale bridge output;

determines an un-offset compensated SetPoint (SP') for the coil driver according to the relationship:

$$SP'/SP\text{-}fs=(Vo\text{-desired})/Vo\text{-}fs$$

where SP-fs is the full scale set point value; and determines the value of a desired set point for the coil driver $$SP=SP'+Vo\text{-}os$$

the SP being used to drive the coil continuously while measuring the bus current using an output of first MR bridge.

27. A magnetic field measuring device as described in claim 26, further including a temperature sensor to initiate operation of the calibration circuit when a change in ambient temperature equals or exceeds a predetermined threshold.

* * * * *